United States Patent
Fukui et al.

(10) Patent No.: US 8,711,012 B2
(45) Date of Patent: Apr. 29, 2014

(54) ENCODING METHOD, DECODING METHOD, ENCODING DEVICE, DECODING DEVICE, PROGRAM, AND RECORDING MEDIUM

(75) Inventors: Masahiro Fukui, Tokyo (JP); Shigeaki Sasaki, Tokyo (JP); Yusuke Hiwasaki, Tokyo (JP); Shoichi Koyama, Tokyo (JP); Kimitaka Tsutsumi, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 13/807,139

(22) PCT Filed: Jul. 4, 2011

(86) PCT No.: PCT/JP2011/065276
§ 371 (c)(1),
(2), (4) Date: Dec. 27, 2012

(87) PCT Pub. No.: WO2012/005212
PCT Pub. Date: Jan. 12, 2012

(65) Prior Publication Data
US 2013/0106626 A1    May 2, 2013

(30) Foreign Application Priority Data
Jul. 5, 2010   (JP) ................. 2010-152971

(51) Int. Cl.
*H03M 7/00* (2006.01)
(52) U.S. Cl.
USPC .......... 341/50; 341/51; 700/94; 704/222
(58) Field of Classification Search
USPC ............ 341/50, 51; 700/94; 704/222
See application file for complete search history.

(56) References Cited

U.S. PATENT DOCUMENTS 7,200,561 B2 * 4/2007 Moriya et al. ............... 704/500
7,283,967 B2 * 10/2007 Nishio et al. ................ 704/500
(Continued)

FOREIGN PATENT DOCUMENTS

EP    1 887 564 A1   2/2008
JP    7 261800       10/1995
(Continued)

OTHER PUBLICATIONS

Office Action issued May 28, 2013 in Japanese Patent Application No. 2012-523859 with English language translation.

(Continued)

*Primary Examiner* — Khai M Nguyen
(74) *Attorney, Agent, or Firm* — Oblon, Spivak, McClelland, Maier & Neustadt, L.L.P.

(57) ABSTRACT

A plurality of samples are vector-quantized to obtain a vector quantization index and quantized values; bits are assigned in a predetermined order of priority based on auditory perceptual characteristics to one or more sets of sample positions among a plurality of sets of sample positions, each set having a plurality of sample positions and being given an order of priority based on the auditory perceptual characteristics, the number of bits not being larger than the number of bits obtained by subtracting the number of bits used for a code corresponding to the vector quantization index from the number of bits assigned for the code corresponding to the vector quantization index; and index information indicating a group of coefficients that minimizes the sum of the error between the value of each sample included in each of the sets of sample positions to which the bits are assigned and the value obtained by multiplying the quantized value of each sample included in the set of sample positions by a coefficient corresponding to the position of the sample, of all the sample positions included in the set of sample positions, is output.

18 Claims, 8 Drawing Sheets

(56) References Cited

U.S. PATENT DOCUMENTS

| | | | |
|---|---|---|---|
| 7,366,320 B2* | 4/2008 | Inoue | 382/100 |
| 7,987,009 B2* | 7/2011 | Liebchen | 700/94 |
| 7,991,012 B2* | 8/2011 | Liebchen | 370/477 |
| 2006/0212290 A1* | 9/2006 | Ide | 704/229 |
| 2007/0253481 A1 | 11/2007 | Oshikiri | |
| 2008/0040120 A1 | 2/2008 | Kurniawati et al. | |
| 2009/0281811 A1 | 11/2009 | Oshikiri et al. | |
| 2011/0044405 A1 | 2/2011 | Sasaki et al. | |

FOREIGN PATENT DOCUMENTS

| | | |
|---|---|---|
| JP | 2002 084194 | 3/2002 |
| WO | 2006 041055 | 4/2006 |
| WO | 2007 043648 | 4/2007 |
| WO | 2009 093714 | 7/2009 |

OTHER PUBLICATIONS

Kumada, S. et al., "Vector Quantization of Transform Coefficients in Audio Transform Coding," Proceedings of Autumn Meeting of the Acoustical Society of Japan, Total 8 Pages, (Oct. 1993) (with English translation).

ITU-T Telecommunication Standardization Sector of ITU, "Digital terminal equipments—Coding of analogue signals by methods other than PCM," Series G: Transmission Systems and Media, Digital Systems and Networks, G.729.1, Total 98 Pages, (May 2006).

ITU-T Telecommunication Standardization Sector of ITU, "Digital terminal equipments—Coding of voice and audio signals," Segies G: Transmission Systems and Media, Digital Systems and Networks, G.718, Total 254 pages, (Jun. 2008).

International Search Report Issued Sep. 6, 2011 in PCT/JP11/065276 Filed Jul. 4, 2011.

Extended Search Report issued Oct. 15, 2013 in European Patent Application No. 11803546.8.

Volodya Grancharov, et al., "Generalized Postfilter for Speech Quality Enhancement", IEEE Transactions on Audio, Speech, and Language processing, vol. 16, No. 1, XP011196564, Jan. 2008, pp. 57-64.

U.S. Appl. No. 13/807,156, filed Dec. 27, 2012, Fukui, et al.

* cited by examiner

ENCODING METHOD, DECODING METHOD, ENCODING DEVICE, DECODING DEVICE, PROGRAM, AND RECORDING MEDIUM

TECHNICAL FIELD

The present invention relates to a technology for encoding or decoding signal sequences of acoustic signals, video signals, and other signals, such as voice and music, by vector quantization.

BACKGROUND ART

In an encoding device disclosed in Patent Literature 1, an input signal is first divided by a normalization value to perform normalization. The normalization value is quantized, and a quantization index is generated. The normalized input signal is vector-quantized, and an index of a representative quantization vector is generated. The generated quantization index and the generated representative quantization vector are output to a decoding device. The decoding device decodes the quantization index and generates a normalization value. The index of the representative quantization vector is also decoded, and a sample sequence is generated. A sequence of the values obtained by multiplying each sample in the generated sample sequence by the normalization value serves as a decoded signal sample sequence.

On the other hand, as highly efficient vector quantization methods that generate little quantization noise, the spherical vector quantization (SVQ) method (refer to Non-Patent Literature 1, for example) and other vector quantization methods that quantize a plurality of input signals together within a predetermined number of quantization bits are widely used.

In the SVQ method, samples of input signals such as modified discrete cosine transform (MDCT) coefficients are normalized by using a quantized normalization value, and the normalized samples are quantized together in units of subbands. Here, the number of bits (quantization bits) are dynamically assigned to a code corresponding to each subband in accordance with perceptual importance of each subband. Assuming that the input signals are sparse, the SVQ method quantizes the main elements of the input signals preferentially. Therefore, input signals having sparse energy in the frequency domain (sparse signals), such as harmonics signals and vowels, can be quantized with high precision.

However, the SVQ method increases the frequency that a frequency component included in the input signals is not included in decoded signals decoded from the quantized values (the decoded signals lack the frequency component) when the samples are quantized for input signals having energy in many frequencies. When the decoded signals lack a frequency component, the presence or absence of the frequency component in the decoded signals varies discontinuously over time at a high frequency. Humans are sensitive to those temporally discontinuous variations in the presence or absence of a frequency component. If the input signals are acoustic signals, these variations may be perceived as noise which is known as musical noise. If the input signals are video signals, block noise, which is equivalent to musical noise in the acoustic signals, may occur. Musical noise and block noise will be referred to as "musical noise and the like" below.

An algebraic vector quantization (AVQ) method (refer to Non-Patent Literature 2, for example) is a vector quantization method in which the decoded signals lack a frequency component at a lower frequency than with the SVQ method. Like the SVQ method, the AVQ method assumes that the signals are sparse, but the AVQ method can provide quantized values with which more frequency components can be restored than with the SVQ method.

Patent Literature 1: Japanese Patent Application Laid Open No. H7-261800

Non-Patent Literature 1: Recommendation ITU-T G.729.1, SERIES G: TRANSMISSION SYSTEMS AND MEDIA, DIGITAL SYSTEMS AND NETWORKS, Digital terminal equipments—Coding of analogue signals by methods other than PCM, G729-based embedded variable bit-rate coder: An 8-32 kbit/s scalable wideband coder bitstream interoperable with G729.

Non-Patent Literature 2: Recommendation ITU-T G.718, SERIES G: TRANSMISSION SYSTEMS AND MEDIA, DIGITAL SYSTEMS AND NETWORKS, Digital terminal equipments—Coding of voice and audio signals, Frame error robust narrow-band and wideband embedded variable bit-rate coding of speech and audio from 8-32 kbit/s.

DISCLOSURE OF THE INVENTION

Problems to be Solved by the Invention

The amplitude quantization precision of the AVQ method is lower than that of the SVQ method, however. Even if the decoded signals lack a frequency component at a low frequency, low amplitude quantization precision could cause musical noise and the like. This problem is not limited to the AVQ method, and is common when musical noise and the like occur depending on the quantization precision. This problem can occur not only when the input signals are frequency-domain signals but also when the input signals are time-domain signals.

The present invention provides a technology for reducing musical noise and the like that can occur depending on the quantization precision.

Means to Solve the Problems

In encoding, a plurality of samples are collectively vector quantized to obtain a vector quantization index and the quantized value of each of the plurality of samples; bits are assigned in a predetermined order of priority based on auditory perceptual characteristics to one or more sets of sample positions among a plurality of sets of sample positions, each set having a plurality of sample positions and being given an order of priority based on the auditory perceptual characteristics, the number of bits not being larger than the number of bits obtained by subtracting the number of bits used for a code corresponding to the vector quantization index from the number of bits assigned for the code corresponding to the vector quantization index; and index information indicating a group of coefficients that minimizes the sum of the error between the value of each sample included in each of the sets of sample positions to which the bits are assigned and the value obtained by multiplying the quantized value of each sample included in the set of sample positions by a coefficient corresponding to the position of the sample, of all the sample positions included in the set of sample positions, among a plurality of groups of predetermined coefficients corresponding to the positions of the samples, is output.

In decoding, a plurality of values corresponding to an input vector quantization index are obtained as decoded values corresponding respectively to a plurality of sample positions; and, with a set of sample positions to which bits are assigned in a predetermined order of priority based on auditory perceptual characteristics being considered as a target of processing among a plurality of sets of sample positions that constitute the plurality of sample positions, and with the use of a group of predetermined coefficients corresponding to the plurality of sample positions and indicated by input index information, the values obtained by multiplying the decoded values and the coefficients, corresponding to the sample positions included in the set of sample positions considered as the target of processing, are output.

Effects of the Invention

In encoding, since index information indicating a group that includes a plurality of gradient coefficients is output to adjust the quantized values of a plurality of samples, the quantization error in decoding can be reduced, and as a result musical noise and the like can be reduced.

In decoding, since a plurality of decoded values are adjusted by using a group that includes a plurality of gradient coefficients indicated by index information, the quantization error can be reduced, and as a result musical noise and the like can be reduced.

DETAILED DESCRIPTION OF THE EMBODIMENTS

Figure 1:
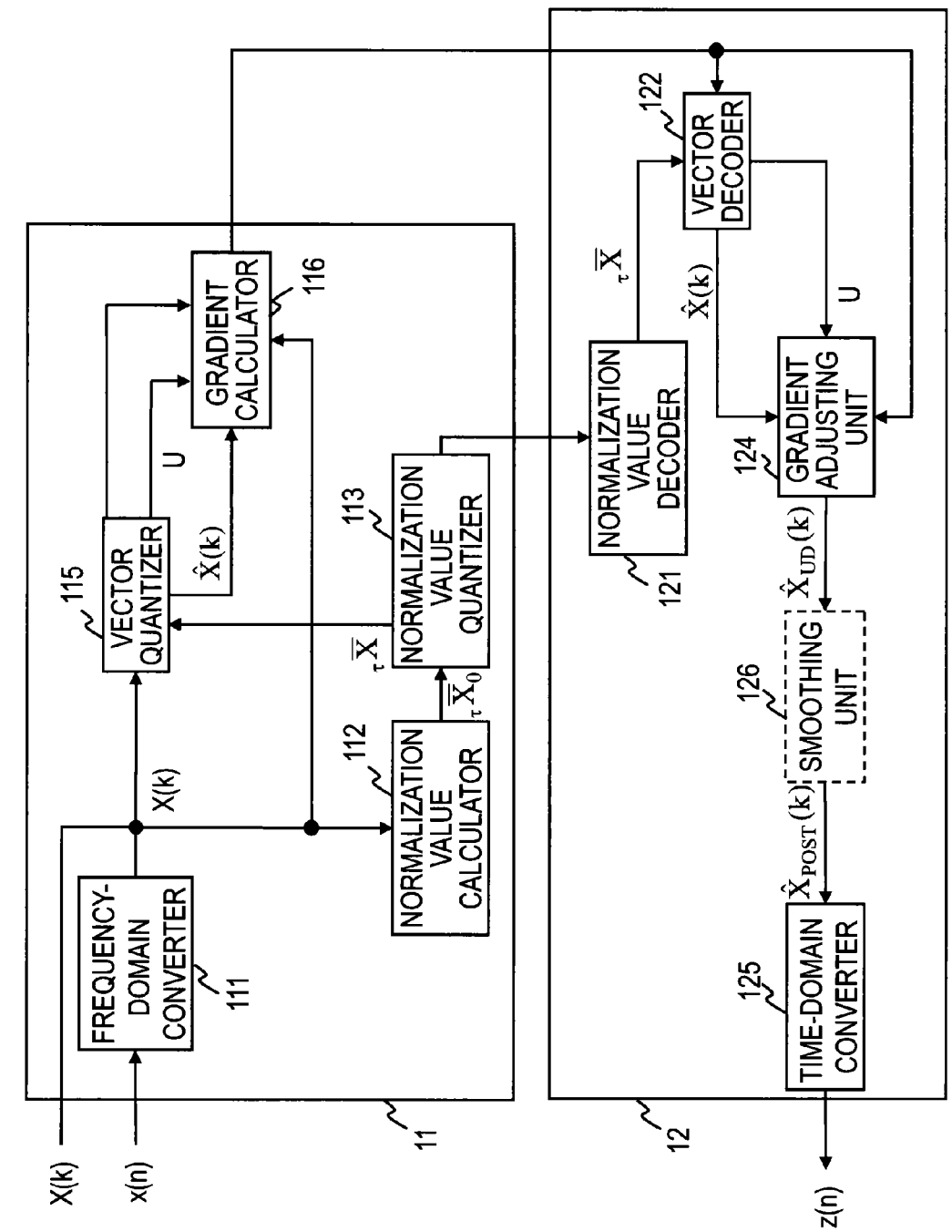
FIG. 1 is a functional block diagram of an encoding device and a decoding device.

An embodiment of the present invention will now be described in detail.
(Configuration)
As shown in FIG. 1, an encoding device 11 in this embodiment includes a normalization value calculator 112, a normalization value quantizer 113, a vector quantizer 115, and a gradient calculator 116, for example. The gradient calculator 116 corresponds to a bit assignment unit and a coefficient group selection unit.

Figure 2:
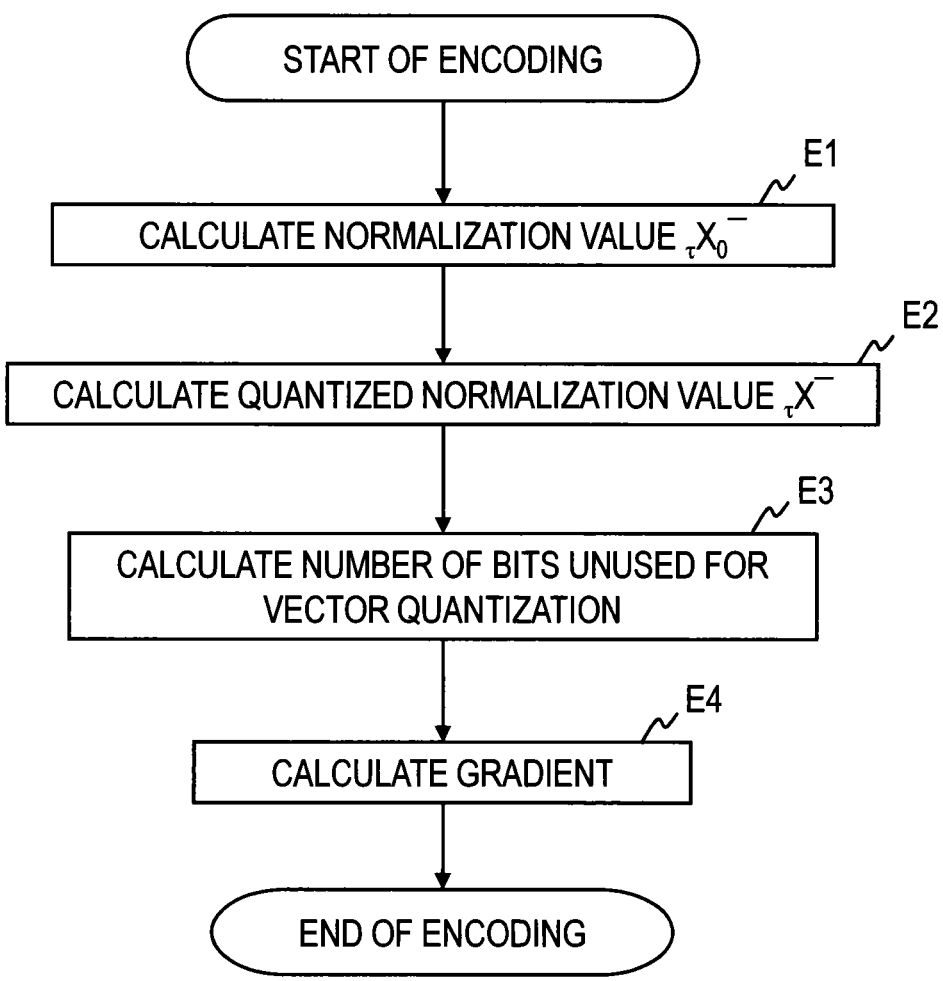
FIG. 2 is a flowchart illustrating an encoding method.

As shown in FIG. 1, a decoding device 12 in this embodiment includes a normalization value decoder 121, a vector decoder 122, and a gradient adjusting unit 124, for example. The encoding device 11 may include a frequency-domain converter 111, for example, when necessary. The decoding device 12 may include a time-domain converter 125 and a smoothing unit 126, for example.
(Encoding)
The encoding device 11 executes the steps of an encoding method illustrated in FIG. 2.

Input signals X(k) are input to the normalization value calculator 112, the vector quantizer 115, and the gradient calculator 116. The input signals X(k) here are frequency-domain signals that can be obtained by transforming time-domain signals x(n), which are time-series signals such as acoustic signals, into the frequency domain. The input signals X(k) in the frequency domain may be input directly to the encoding device 11. Alternatively, the frequency-domain converter 111 may transform the input signals x(n) in the time domain into the frequency domain to generate the input signals X(k) in the frequency domain. When the frequency-domain converter 111 generates the input signals X(k) in the frequency domain, the frequency-domain converter 111 transforms the input signals x(n) in the time domain to the input signals X(k) in the frequency domain by modified discrete cosine transform (MDCT), for example. Here, n indicates the number (discrete time number) of the signals in the time domain, and k indicates the number (discrete frequency number) of the signals (samples) in the frequency domain. A larger n value corresponds to a later time. A larger k value corresponds to a higher frequency. When a single frame includes L samples, the time-domain signals x(n) are transformed into the frequency domain in units of frames, and the input signals X(k) (k=0, 1, . . . , L−1) forming L frequency components in the frequency domain are generated. Here, L is a given positive integer greater than 1, such as 64 or 80. When MDCT is used, the input time-series signals are transformed into the frequency domain in units of frames each including L samples, and the frame to be transformed shifts by ½ frame, or L/2 samples at a time.

The normalization value calculator 112 calculates a normalization value $_\tau \bar{X}_0$, which is a value representing a predetermined $C_0$ samples in L samples of the input signals X(k), in each frame (step E1). Here, $_\tau \bar{X}_0$ is the character $_\tau X_0$ with an overbar, where $\tau$ is a unique integer not smaller than 0, assigned to each sub-band formed of the predetermined $C_0$ samples out of L samples in a single frame.

$C_0$ is L or a common divisor of L other than 1 or L. Setting $C_0$ to a common divisor of L other than 1 or L means that the group of L samples is divided into sub-bands (corresponding to sets of sample positions), and a normalization value is obtained for each group of $C_0$ samples constituting each sub-band. For example, when L=64 and when eight frequency components constitute a sub-band, eight sub-bands are formed, and a normalization value is calculated for each sub-band. When $C_0$ is L, $\tau=0$, and the normalization value $_\tau \bar{X}_0$ represents L samples. In other words, when $C_0$ is L, a single normalization value $_\tau \bar{X}_0$ is calculated for each frame. When $C_0$ is a common divisor of L other than 1 or L, $\tau$ is an integer $\tau=0, \ldots, (L/C_0)-1$ corresponding to each sub-band in the single frame, and the normalization value $_\tau \bar{X}_0$ is a value representing $C_0$ samples included in the sub-frame corresponding to $\tau$. That is, when $C_0$ is a common divisor of L other than 1 or L, $L/C_0$ normalization values $_\tau \bar{X}_0$ ($\tau=0, \ldots, (L/C_0)-1$) are calculated for each frame. Independently of the value of $C_0$, $k=\tau \cdot C_0, \ldots, (\tau+1) \cdot C_0 - 1$. The value $_\tau \bar{X}_0$ calculated by the normalization value calculator 112 is sent to the normalization value quantizer 113.

[Examples of Normalization Value $_\tau \bar{X}_0$]

The normalization value $_\tau \bar{X}_0$ is a representative value of $C_0$ samples. In other words, the normalization value $_\tau \bar{X}_0$ is a value that corresponds to $C_0$ samples. An example of the normalization value $_\tau \bar{X}_0$ is the following square root to a power average value of the $C_0$ samples.

$$_\tau \bar{X}_0 = \sqrt{\frac{\sum_{k=\tau \cdot C_0}^{(\tau+1) \cdot C_0 - 1} X(k)^2}{C_0}}$$

Another example of the normalization value $_\tau \bar{X}_0$ is the following value, which is obtained by dividing, by $C_0$, the square root to a total power value of the $C_0$ samples.

$$_\tau\overline{X}_0 = \frac{\sqrt{\sum_{k=\tau\cdot C_0}^{(\tau+1)\cdot C_0-1} X(k)^2}}{C_0}$$

Still another example of the normalization value $_\tau X_0^-$ is the following average amplitude value of the $C_0$ samples.

$$_\tau\overline{X}_0 = \frac{\sum_{k=\tau\cdot C_0}^{(\tau+1)\cdot C_0-1} |X(k)|}{C_0}$$

The normalization value $_\tau X_0^-$ is not limited to the examples given above (the description of [Examples of normalization value $_\tau X_0^-$] ends here).

The normalization value quantizer 113 quantizes the normalization value $_\tau X^-$ to obtain a quantized normalization value $_\tau X^-$ and obtains a normalization-value quantization index corresponding to the quantized normalization value $_\tau X^-$ (step E2). Here, $_\tau X^-$ is the character $_\tau X^-$ with an overbar. The quantized normalization value $_\tau X^-$ is sent to the vector quantizer 115, and a code (bit stream) corresponding to the normalization-value quantization index is sent to the decoding device 12.

The vector quantizer 115 generates a vector quantization index by collectively vector-quantizing a plurality of samples X(k) out of L samples of the input signals X(k) in each frame. The vector quantization index is an index indicating a representative quantization vector. The vector quantizer 115 here normalizes a plurality of X(k)'s by using the quantized normalization value $_\tau X^-$ and obtains a plurality of normalized samples X(k)'. For example, the vector quantizer 115 obtains X(k)' by dividing X(k) by $_\tau X^-$ or by multiplying X(k) by the reciprocal of $_\tau X^-$. The vector quantizer 115 performs vector quantization by selecting a representative quantization vector closest to the vector composed of the plurality of samples X(k)', out of a plurality of representative quantization vectors stored in a vector codebook storage, which is not shown in the drawings, and outputting a vector quantization index indicating the selected representative quantization vector, for example. The vector quantizer 115 vector-quantizes $C_0$ samples X(k)' together, for example. The vector quantizer 115 performs vector quantization by using a vector quantization method such as the AVQ method (refer to Non-Patent Literature 2, for example), but any other vector quantization method may be used. When $C_0$ is the number of samples in the sub-band, vector quantization may be unperformed on a sub-band with a low priority given in accordance with human auditory perceptual characteristics. A sub-band corresponding to a frequency that is easier to be perceived by humans is given a higher priority, for example. A sub-band having a greater quantized normalization value $_\tau X^-$ is given a higher priority, for example.

The bit number of a code obtained by the vector quantization varies depending on the input signals. For some input signals, the bit number of a code (the vector quantization index or the like) obtained by the vector quantization may be less than a bit number assigned for the vector quantization, and part of bits assigned for the vector quantization may remain unused. The "bits assigned for the vector quantization" mean bits assigned for a code (a code corresponding to the vector quantization index) obtained by the vector quantization, among codes sent from the encoding device 11 to the decoding device 12. The "bit number assigned for the vector quantization" means the bit number of the bits assigned for the vector quantization. The "bit number assigned for the vector quantization" may be determined for each frame, or may be determined for each sub-band. In addition, the "bit number assigned for the vector quantization" may vary depending on the input signal, or may be constant irrespective of the input signal. The vector quantizer 115 calculates the number of bits that are not used in actual vector quantization, among the bits assigned for vector quantization, as the number of unused bits, U. In this embodiment, the number of unused bits, U, is calculated in each frame (in units of L samples). For example, the vector quantizer 115 obtains the number of unused bits, U, by subtracting, from the number of bits assigned for vector quantization in a target frame to be processed, the total number of bits of the vector quantization index obtained by vector quantization of L samples included actually in the frame. Here, U is an integer not smaller than 0.

The vector quantizer 115 further obtains a plurality of quantized values X^(k), which are local-decoded values of the vector quantization index, and outputs them. For example, the vector quantizer 115 outputs the values obtained by denormalizing the components X(k)' of the representative quantization vector indicated by the vector quantization index, by using the quantized normalization value $_\tau X^{-1}$, as the quantized values X^(k) of X(k). For example, the vector quantizer 115 outputs the products of X(K)' and $_\tau X^-$ as quantized values X^(k). Here, the quantized values X^(k) equal the decoded values X^(k) obtained by the decoding device 12. The quantized values X^(k) of a sub-band that is not subjected to vector quantization become 0. Here, X^ indicates X with a superscript caret immediately above it.

The vector quantizer 115 sends the vector quantization index, the number of unused bits, U, and the quantized values X^(k) to the gradient calculator 116 (step E3).

The gradient calculator 116 holds $M_{MAX}$ groups of $C_0$ gradient coefficients (tilt correction gains), for example, in a storage, which is not shown in the drawings. Here, $M_{MAX}$ is an integer not smaller than 2. For example, the gradient calculator 116 holds a gradient matrix γ given by Equation (1) where a gradient coefficient vector $\gamma_m = [\gamma_m(0), \ldots \gamma_m(C_0-1)]$ (a group of a plurality of gradient coefficients) composed of $C_0$ gradient coefficients (tilt correction gains) $\gamma_m(k')$ (k'=0, ..., $C_0$−1) is provided as a row vector in the m-th row (m=0, ..., $M_{MAX}$−1).

$$\gamma = \begin{bmatrix} \gamma_0(0) & \cdots & \gamma_0(k) & \cdots & \gamma_0(C_0-1) \\ \vdots & \ddots & & & \vdots \\ \gamma_m(0) & & \gamma_m(k) & & \gamma_m(C_0-1) \\ \vdots & & & \ddots & \vdots \\ \gamma_{M_{MAX}-1}(0) & \cdots & \gamma_{M_{MAX}-1}(k) & \cdots & \gamma_{M_{MAX}-1}(C_0-1) \end{bmatrix} \quad (1)$$

The gradient calculator 116 obtains the row number m' of the gradient coefficient vector that minimizes the error between a first vector composed of values corresponding to $C_0$ input samples X(k) (k=τ·$C_0$, ..., (τ+1)·$C_0$−1) and a second vector composed of values corresponding to $C_0$ adjusted values obtained by multiplying the input $C_0$ quantized values X^(k) (k=τ·$C_0$, ..., (τ+1)·$C_0$−1) by the elements $\gamma_m(k')$ (k'=0, ..., $C_0$−1) of the gradient coefficient vector $\gamma_m$, and writes index information idx indicating the row number m' in the region of bits that are not used (referred to as an unused bit region), out of the bits assigned for vector quantization.

In other words, the gradient calculator 116 finds, out of a gradient matrix γ having gradient coefficient vectors $\gamma_m$ each composed of a plurality of gradient coefficients $\gamma_m(k')$ as row vectors, the gradient coefficient vector that minimizes the error between a first vector composed of values corresponding to a plurality of samples X(k) and a second vector composed of values corresponding to the adjusted values obtained by multiplying the plurality of quantized values X^(k) by the elements of the gradient coefficient vector $\gamma_m$, outputs index information idx indicating the row number m' of that gradient coefficient vector, and places it in the unused bit region of the code (bit stream) corresponding to the vector quantization index (step E4).

With this step, the encoding device 11 can send information for adjusting the quantization error of the amplitude to the decoding device 12, using the unused bit region effectively, and can reduce musical noise and the like generated in accordance with the quantization precision.

The $C_0$ gradient coefficients $\gamma_m(0), \ldots, \gamma_m(C_0-1)$ constituting the gradient coefficient vector $\gamma_m$ are correlated with one another. In other words, each gradient coefficient vector $\gamma_m$ is a vector composed of a plurality of mutually correlated gradient coefficients $\gamma_m(0), \ldots, \gamma_m(C_0-1)$. It is the frequent case that $X(\tau \cdot C_0), \ldots, X((\tau+1) \cdot C_0-1)$ are distributed lopsidedly on a straight line or a curve in a (k, X(k)) plane having k on its first axis and X(k) on its second axis. By using the gradient coefficient vector $\gamma_m$ composed of the gradient coefficients $\gamma_m(0), \ldots, \gamma_m(C_0-1)$ with such characteristics of $X(\tau \cdot C_0), \ldots, X((\tau+1) \cdot C_0-1)$ being taken into consideration, the quantization error can be adjusted with high precision. For example, it is assumed that the gradient coefficients $\gamma_m(0), \ldots, \gamma_m(C_0-1)$ corresponding to the same row number m are distributed lopsidedly on a straight line or a specific curve in a (k', $\gamma_m(k')$) plane having k' (value corresponding to a frequency corresponding to the gradient coefficient $\gamma_m(k')$) on its first axis and $\gamma_m(k')$ (value of gradient coefficient) on its second axis. In other words, it is assumed, for example, that the gradient coefficient vector $\gamma_m$ is a vector composed of a plurality of gradient coefficients $\gamma_m(0), \ldots, \gamma_m(C_0-1)$ distributed lopsidedly on a straight line or a specific curve in the (k', $\gamma_m(k')$) plane having the value k' corresponding to the order of the element in the vector on its first axis and the value $\gamma_m(k')$ of a vector element on its second axis. More specifically, it is assumed, for example, that the gradient coefficients $\gamma_m(0), \ldots, \gamma_m(C_0-1)$ corresponding to the same row number m are placed on a straight line or a specific curve on the (k', $\gamma_m(10)$ plane. In other words, it is assumed that a vector composed of the gradient coefficients $\gamma_m(0), \ldots, \gamma_m(C_0-1)$ on a straight line or a specific curve in the (k', $\gamma_m(10)$ plane is provided as the gradient coefficient vector $\gamma_m$. The straight lines or specific curves in the (k', $\gamma_m(k')$) plane are different depending on the row numbers m, for example. An example of the gradient matrix γ is shown below. The example shown is characterized by $C_0=8$ and $M_{MAX}=3$. In the example, the gradient coefficients $\gamma_m(0), \ldots, \gamma_m(7)$ are placed on a straight line given for each row number m (m=0, 1, 2).

$$\gamma = \begin{bmatrix} 1.35 & 1.25 & 1.15 & 1.05 & 0.95 & 0.85 & 0.75 & 0.65 \\ 1.175 & 1.125 & 1.075 & 1.025 & 0.975 & 0.925 & 0.875 & 0.825 \\ 0.65 & 0.75 & 0.855 & 0.95 & 1.05 & 1.15 & 1.25 & 1.35 \end{bmatrix}$$

Examples of the first vector include a vector composed of $C_0$ X(k)'s, a vector composed of the magnitude |X(k)| of $C_0$ X(k)'s, and a vector composed of $C_0$ X(k)'s or |X(k)|'s multiplied by a constant or a variable. Examples of the second vector include a vector composed of $C_0$ adjusted values, a vector composed of the magnitude of the $C_0$ adjusted values, and a vector composed of $C_0$ adjusted values or their magnitude multiplied by a constant or a variable. Examples of adjusted values include the product of X^(k) and $\gamma_m(k')$, the product of the magnitude |X^(k)| of X^(k) and $\gamma_m(k')$, the magnitude of the product of X^(k) and $\gamma_m(k')$, a value indicating the magnitude of the product of X^(k) and $\gamma_m(k')$, and a value corresponding to the product of X^(k) and $\gamma_m(k')$.

An example of the error between the first vector and the second vector is the distance between the first vector and the second vector. The distance is not especially defined and can be the Manhattan distance, the Euclidean distance, variations of those distances, and the like. Examples of the gradient coefficient vector that minimizes the error between the first vector and the second vector include a gradient coefficient vector that minimizes the error between the first vector and the second vector and a gradient coefficient vector that minimizes the error between the first vector and the second vector under given search conditions or within a given search range.

The unused bit region can be identified by the reference position (first address, for example) of a determined unused bit region and the input number of unused bits, U. The upper limit of the number of bits of the index information idx that can be written in the unused bit region is the number of unused bits, U. Therefore, the index information idx corresponding to all the row numbers cannot always be written in the unused bit region. So, the gradient calculator 116 specifies the range of row numbers that can be identified by the index information idx that can be written in the unused bit region as the search range. In other words, the gradient calculator 116 selects just a row number indicated by index information idx that can be written in the unused bit region. For example, the gradient calculator 116 identifies a row number m' as given below, among the $m_{MAX}$ row numbers m=0, ..., $m_{MAX}-1$ that can be identified by index information idx that can be written in the unused bit region, and writes index information idx corresponding to the row number m' in the unused bit region.

$$m' = \arg\min_{m} \|\chi - A_m \cdot \hat{\chi}\|$$

The symbol ||•|| indicates the norm of; $\text{argmin}_m \|\bullet\|$ means that m minimizing ||•|| becomes m'; $\text{argmin}_m$ means argmin with subscript m; and $\chi=[X(\tau \cdot C_0), \ldots, X((\tau+1) \cdot C_0-1)$, $\hat{\chi}=[X^(\tau \cdot C_0), \ldots, X^((\tau+1) \cdot C_0-1)]$; and $A_m$ means a diagonal matrix having gradient coefficient vectors $\gamma_m=[\gamma_m(0), \ldots, \gamma_m(C_0-1)]$ (m=0, ..., $m_{MAX}-1$) corresponding to the row number m as its diagonal elements, as shown below.

$$A_m = \begin{bmatrix} \gamma_m(0) & & 0 \\ & \ddots & \\ 0 & & \gamma_m(C_0-1) \end{bmatrix}$$

When $C_0$ is the number of samples in a sub-band (τ>0), the gradient calculator 116 places index information idx indicating the row number m' of the gradient coefficient vector in the unused bit region for each sub-band. In this case, in order to store index information idx corresponding to each sub-band, the unused bit region must be split for the sub-bands. The gradient calculator 116 determines the bit region in which index information idx of each sub-band is placed in the unused bit region in a predetermined order of priority based on human auditory perceptual characteristics, for example.

The gradient calculator 116 determines the size of the bit region where index information idx corresponding to each sub-band (corresponding to a set of sample positions) is placed in accordance with the priority level given to the sub-band, for example. A sub-band corresponding to a frequency that is easier to be perceived by humans is given a higher priority, for example. The gradient calculator 116 preferentially places index information idx of a sub-band with a higher priority in the unused bit region, for example. Specifically, the gradient calculator 116 makes the bit region where index information idx corresponding to a sub-band with higher priority is placed larger than the bit region where index information idx corresponding to a sub-band with lower priority is placed. In other words, the number of bits assigned to a first sub-band of the sub-bands is not smaller than the number of bits assigned to a second sub-band having a lower priority than the first sub-band. For example, the gradient calculator 116 does not assign a bit region for placing index information idx corresponding to a sub-band that has not been vector-quantized in the vector quantizer 115. For example, since $\hat{X}(k)$ of a sub-band that has not been vector-quantized are all 0, the gradient calculator 116 does not assign a bit region for placing index information idx of a sub-band if the sum of the amplitudes or energies of the included $\hat{X}(k)$ elements is 0. For the sub-band that has not been vector-quantized, processing to identify index information idx, for example, is not necessary either.

As described above, the gradient calculator 116 assigns at least some of the bits that are not actually used for the code corresponding to the vector quantization index, of the bits assigned for the code corresponding to the vector quantization index, to a plurality of samples in a predetermined order of priority based on the auditory perceptual characteristics, and outputs index information idx having the number of bits assigned to the plurality of samples.

In other words, the gradient calculator 116 assigns bits the number of which is equal to or smaller than the number of bits obtained by subtracting the number of bits used for a code corresponding to the vector quantization index from the number of bits assigned for the code corresponding to the vector quantization index, to one or more sets of sample positions out of a plurality of sets of sample positions, each set including a plurality of sample positions and being given a priority level based on auditory perceptual characteristics, in a predetermined order of priority based on the auditory perceptual characteristics, and outputs index information idx indicating a group of coefficients that minimizes the sum of the error between the value of each sample belonging to each of the set of sample positions to which the bits are assigned, and the product of the quantized value of the sample belonging to the set of sample positions and a coefficient corresponding to the position of the sample, of all the sample positions belonging to the set of sample positions, out of a plurality of groups of predetermined coefficients corresponding to the positions of the samples. The positions of samples in this embodiment are positions on the frequency axis, corresponding to discrete frequency numbers k.

Now, index information idx can be transmitted just by using the unused bit region.

Example 1 of Step E4

Figure 3:
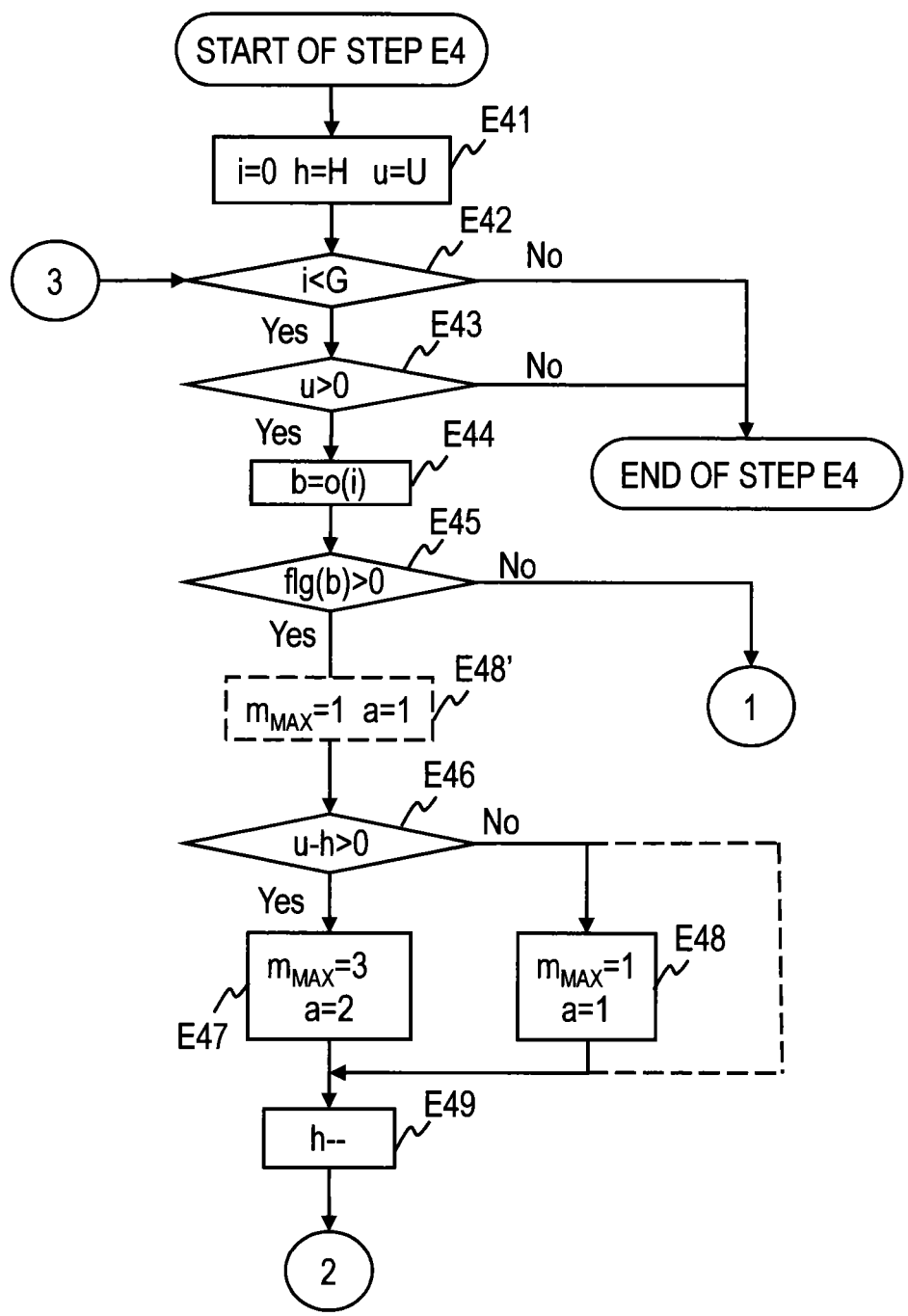
FIG. 3 is a flowchart illustrating an example of step E4.
Figure 4:
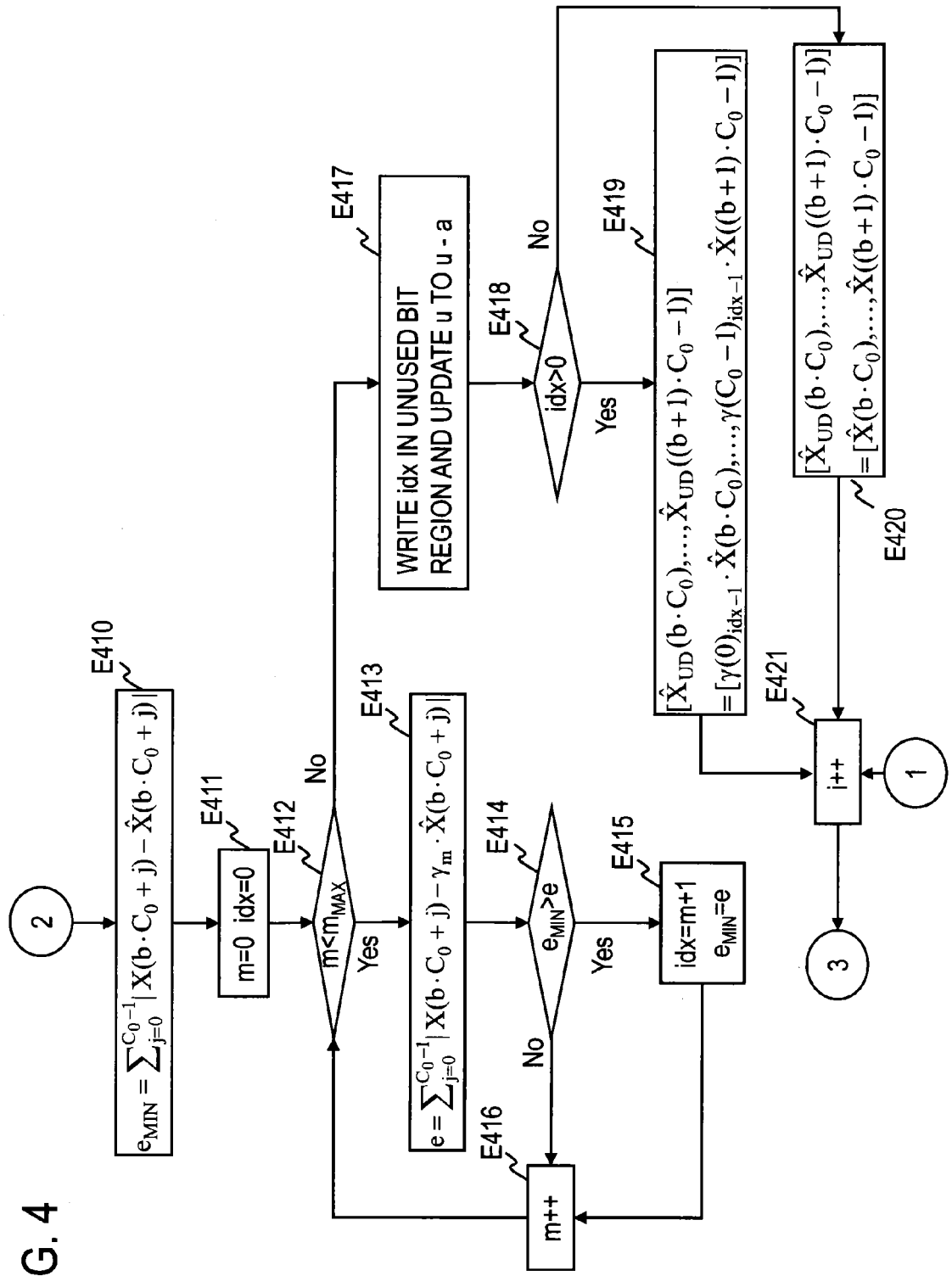
FIG. 4 is a flowchart illustrating the example of step E4.

The gradient calculator 116 in this example executes the steps shown in FIGS. 3 and 4 to write index information idx indicating the row number of the selected gradient coefficient vector in the unused bit region.

The gradient calculator 116 initializes the i, h, and u values to 0, H, and U, respectively (step E41), and proceeds to step E42. When $C_0$ indicates the number of samples in the sub-band, H indicates the number of sub-bands in a single frame that has been vector-quantized in the vector quantizer. When $C_0$ indicates the number of samples, L, in a single frame, H becomes 1.

The gradient calculator 116 compares i with G (G=L/$C_0$) (step E42) and, if i<G is satisfied, proceeds to step E43 or, if i<G is not satisfied, ends the processing of step E4. When $C_0$ indicates the number of samples in the sub-band, G indicates the total number of sub-bands in a single frame. When $C_0$ indicates the number of samples, L, in a single frame, G=1. When δ is compared with η, the comparison method is not limited, and any comparison method that can decide the magnitude relationship between δ and η can be used. For example, processing that compares δ with η to ascertain whether δ<η is satisfied may decide whether δ<η is satisfied, whether 0<η−δ is satisfied, whether δ≥η is satisfied, or whether 0≥η−δ is satisfied.

In step E43, the gradient calculator 116 compares u with 0 (step E43) and, if u>0 is not satisfied, ends the processing of step E4 or, if u>0 is satisfied, sets b=o(i) (step E44). When $C_0$ indicates the number of samples in the sub-band, o(i) indicates the i-th element (index) (i=0 to (L/$C_0$)−1) in a set S where 0 or more integer indexes each identifying a sub-band in a single frame are arranged in order of descending priority. For example, when the total number L/$C_0$ of sub-bands in a single frame is 8 and the sub-bands are identified with numbers 0 to 7 in a set S={1, 0, 3, 2, 5, 4, 6, 7}, o(i) indicates the i-th element from the beginning of the set S={1, 0, 3, 2, 5, 4, 6, 7}. The first element is referred to as the 0-th element. In this example, the sub-band identified with 0 has the highest priority, and the sub-band identified with 7 has the lowest priority. The priority levels of sub-bands included in a single frame may be dynamically determined in accordance with the input signal X(k) or may be fixedly determined. When the priority levels are dynamically determined, the higher priority level is assigned to the sub-band corresponding to the larger quantized normalization value $_\tau\bar{x}$, for example. When the priority levels are fixedly determined, the priority level of each sub-band is determined in consideration of human auditory perceptual characteristics, for example (the higher priority levels are assigned to the sub-bands corresponding lower frequencies, for example.) When $C_0$ indicates the number of samples, L, in a single frame, o(i)=0.

The gradient calculator 116 compares flg(b) with 0 (step E45). If flg(b)>0 is not satisfied (if flg(b)=0), i is incremented by 1 (the i value is updated by setting i+1 as a new i value) (step E421), and the processing proceeds to step E42. Here, flg(b) is a quantization flag that indicates whether vector quantization of a sub-band (set of samples to be processed) identified by b has been performed by the vector quantizer 115. For b identifying a sub-band that has been vector-quantized, flg(b)=η(η>0, for example, η=1). For b identifying a sub-band that has not been vector-quantized, flg(b)=0. When the total energy of the quantized values $\hat{X}(k)$ of the sub-band identified by b is 0, flg(b)=0; otherwise, flg(b)=1.

If flg(b)>0 (flg(b)=η) is satisfied in step E45, the gradient calculator 116 compares u−h with 0 (equivalent to comparing u and h) (step E46); and if u−h>0 is satisfied, $m_{MAX}$=3 and a=2 are set (step E47). If u−h>0 is not satisfied, $m_{MAX}$=1 and a=1 are set (step E48). If the number of remaining bits, u, that are not assigned to any sub-band, of the bits that are not used for the code corresponding to the vector quantization index, is not larger than the number of sub-bands, h, to which bits are not assigned, a first number of bits (a=1) is assigned to the sub-band having the highest priority among the sub-bands to which the bits are not assigned. If the number of remaining bits, u, is larger than the number of sub-bands, h, a second number of bits (a=2) that is larger than the first number of bits (a=1) is assigned to the sub band having the highest priority among the sub-bands to which the bits are not assigned. Here, $m_{MAX}$ specifies the search range of the gradient matrix γ. The search range becomes the gradient coefficient vectors $γ_m$ of the gradient matrix γ having row numbers m=0 to $m_{MAX}−1$. In this example, the maximum value $M_{MAX}$ (Equation (1)) of the row number of the gradient matrix γ is 2 or greater; "a" indicates the upper limit of the number of bits of index information idx indicating the row number m of the gradient coefficient vector $γ_m$ in the search range. With "a" bits, $2^a$ values can be transmitted, but one of the $2^a$ values is assigned to idx=0, indicating that no correction is made.

The gradient calculator 116 decrements h (updates the h value by setting h−1 as a new h value) (step E49) and performs the calculation given by the equation below (step E410).

$$e_{MIN} = \sum_{j=0}^{C_0-1} |X(b \cdot C_0 + j) - \hat{X}(b \cdot C_0 + j)| \quad (2)$$

The gradient calculator 116 initializes the values of m and idx to 0 (step E411) and proceeds to step E412.

In step E412, the gradient calculator 116 compares m with $m_{MAX}$ (step E412). If m<$m_{MAX}$ is satisfied, the calculation given by the equation below is performed (step E413). Then, $e_{MIN}$ is compared with e (step E414), if $e_{MIN}$>e is not satisfied, m is incremented by 1 (step E416), and the processing proceeds to step E412. If $e_{MIN}$>e is satisfied, the gradient calculator 116 updates idx and $e_{MIN}$ to idx=m+1 and $e_{MIN}$=e, respectively (step E415), increments m by 1 (step E416), and proceeds to step E412.

$$e = \sum_{j=0}^{C_0-1} |X(b \cdot C_0 + j) - γ_m \cdot \hat{X}(b \cdot C_0 + j)| \quad (3)$$

If m<$m_{MAX}$ is not satisfied in step E412, the gradient calculator 116 writes idx in the unused bit region, updates the u value by setting u−a as a new u value (step E417), and proceeds to step E418. Here, the gradient calculator 116 writes idx in the "a" unused bits in the unused bit region. Preparation should be made such that the decoding device 12 can find necessary idx in the unused bit region, in accordance with "a". For example, the order of assignment of the unused regions in the unused bit region may be determined in advance, and the gradient calculator 116 may determine the region where idx is stored in that order.

In step E418, the gradient calculator 116 decides whether idx>0 (whether idx=0) is satisfied (step E418); and if idx>0 is satisfied (idx=0 is not satisfied), a plurality of quantized values $\hat{X}(b \cdot C_0), \ldots, \hat{X}((b+1) \cdot C_0 - 1)$ are updated as shown below (step E419), i is incremented by 1 (step E421), and the processing proceeds to step E42.

$[\hat{X}_{UD}(b \cdot C_0), \ldots, \hat{X}_{UD}((b+1) \cdot C_0 - 1)] = [γ(0)_{idx-1} \cdot \hat{X}(b \cdot C_0), \ldots, γ(C_0-1)_{idx-1} \cdot \hat{X}((b+1) \cdot C_0 - 1)]$ If idx>0 is not satisfied (idx=0 is satisfied), the gradient calculator 116 does not update a plurality of quantized values $\hat{X}(b \cdot C_0), \ldots, \hat{X}((b+1) \cdot C_0 - 1)$, which are local decode values, (step E420), but increments i by 1 (step E421), and proceeds to step E42.

$[\hat{X}_{UD}(b \cdot C_0), \ldots, \hat{X}_{UD}((b+1) \cdot C_0 - 1)] = [\hat{X}(b \cdot C_0), \ldots, \hat{X}((b+1) \cdot C_0 - 1)]$ As described above, the gradient calculator 116 outputs index information idx that can be expressed by the bits assigned to the sub-band to be processed (a set of samples to be processed).

[Example 2 of Step E4]

Step E4 may be executed as described below, for example, as illustrated in FIGS. 3 and 4.

After steps E41 to E45 are executed, if it is decided in step E45 that flg(b)>0 is not satisfied (flg(b)=0 is satisfied), the gradient calculator 116 increments i by 1 (step E421) and proceeds to step E42. If it is decided in step E45 that flg(b)>0 is satisfied (flg(b)=η is satisfied), the gradient calculator 116 sets $m_{MAX}$=1 and a=1 (step E48') and proceeds to step E46.

In step E46, the gradient calculator 116 compares u−h with 0 (equivalent to comparing u with h); and if u−h>0 is satisfied (step E46), $m_{MAX}$=3 and a=2 are set (step E47), and the processing proceeds to step E49. If u−h>0 is not satisfied, the processing proceeds to step E49 without changing $m_{MAX}$ and "a". The remaining part of the processing is the same as in Example 1 of step E4. The gradient calculator 116 here outputs index information idx that can be expressed with the bits assigned to the sub-band to be processed (set of samples to be processed).

Example 3 of Step E4

In Examples 1 and 2 of step E4, the following calculation may be made instead of Equation (2).

$$e_{MIN} = \sum_{j=0}^{C_0-1} \left| |X(b \cdot C_0 + j)| - |\hat{X}(b \cdot C_0 + j)| \right|$$

In Examples 1 and 2 of step E4, the following calculation may be made instead of Equation (3).

$$e = \sum_{j=0}^{C_0-1} \left| |X(b \cdot C_0 + j)| - γ_m \cdot |\hat{X}(b \cdot C_0 + j)| \right|$$

The description of [Examples of step E4] ends here.

The code (bit stream) corresponding to an modified vector quantization index that includes the vector quantization index and the index information idx written in the unused bit region is sent to the decoding device 12.

(Decoding)

Figure 5:
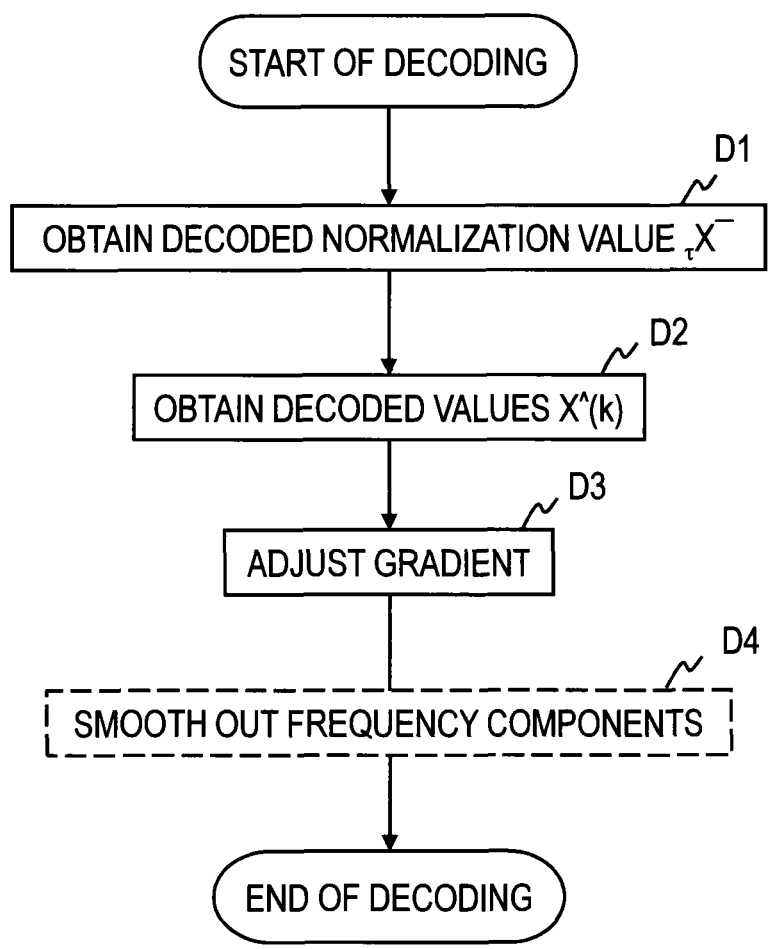
FIG. 5 is a flowchart illustrating a decoding method.

The decoding device 12 executes the steps of a decoding method illustrated in FIG. 5.

The normalization value decoder 121 obtains a decoded normalization value $_τX^−$ corresponding to the normalization-value quantization index input to the decoding device 12 (step D1). The decoded normalization value $_τX^−$ is sent to the vector decoder 122.

It is assumed that normalization values corresponding to a plurality of normalization-value quantization indexes are stored in a codebook storage, which is not shown in the drawings. The normalization value decoder 121 searches through the codebook storage by using the input normalization-value quantization index as a key and obtains the normalization value corresponding to the normalization-value quantization index as the decoded normalization value $_τX^−$.

The vector decoder 122 obtains a plurality of values corresponding to the vector quantization index included in the modified vector quantization index input to the decoding device 12, as a plurality of decoded values X^(k). The vector decoder 122 calculates the number of unused bits, U, by using the vector quantization index (step D2).

In this embodiment, it is assumed that representative quantization vectors corresponding to the plurality of vector quantization indexes are stored in the vector codebook storage, which is not shown in the drawings. The vector decoder 122 searches through the vector codebook storage by using the representative quantization vector corresponding to the input vector quantization index as a key and obtains the representative quantization vector corresponding to the vector quantization index. The vector decoder 122 outputs the decoded values X^(k) obtained by denormalizing the elements X(k)' of the representative quantization vector with the quantized normalization value $_rX^-$. The vector decoder 122 outputs the products of X(k)' and $_rX^-$ as decoded values X^(k), for example.

The vector decoder 122 calculates the number of unused bits, U, that are not actually used in vector quantization, out of the bits assigned for vector quantization. In this embodiment, the vector decoder 122 calculates the number of unused bits, U, in each frame (in units of L samples). For example, the vector decoder 122 calculates the number of unused bits, U, by subtracting, from the number of bits assigned for vector quantization in the target frame to be processed, the total number of bits of the vector quantization index corresponding to the frame.

The decoded values X^(k) and the number of unused bits, U, are sent to the gradient adjusting unit 124.

The gradient adjusting unit 124 holds the same gradient matrix γ (see Equation (1)) as used in the encoding device 11, in a storage, which is not shown in the drawings, for example The gradient adjusting unit 124 reads the index information idx from the unused bit region included in the modified vector quantization index input to the decoding device 12 and adjust the $C_0$ decoded values X^(k) ($k=\tau \cdot C_0, \ldots, (\tau+1) \cdot C_0 - 1$) by using the elements $\gamma_m(k')$ ($k'=0, \ldots, C_0-1$) of the gradient coefficient vector $\gamma_{m'}$ of the row number m' indicated by idx. In other words, the gradient adjusting unit 124 adjusts the plurality of decoded values X^(k) by using the elements $\gamma_{m'}(k')$ of the gradient coefficient vector $\gamma_{m'}$ of the row number m' indicated by the index information idx in the gradient matrix γ having, as row vectors, the gradient coefficient vectors $\gamma_m$ composed of a plurality of gradient coefficients $\gamma_m(k')$ (step D3). The gradient adjusting unit 124 obtains, for example, the products of the decoded values X^(k) and the elements $\gamma_{m'}(k')$ of the gradient coefficient vector $\gamma_{m'}$ of the row number m' indicated by the index information idx, as adjusted values $\hat{X}_{UD}(k)$ of the decoded values X^(k). The gradient adjusting unit 124 outputs the adjusted values $\hat{X}_{UD}(k)$. In other words, the gradient adjusting unit 124 handles, as the target of processing, a set of sample positions to which the bits have been assigned in the predetermined order of priority based on the auditory perceptual characteristics, out of the plurality of sets of sample positions constituting a plurality of sample positions, uses a group of predetermined coefficients corresponding to the plurality of sample positions, indicated by the input index information idx, and outputs the products of the coefficients and the decoded values, corresponding to the respective sample positions included in the set of sample positions to be processed.

[Example 1 of Step D3]

Figure 6:
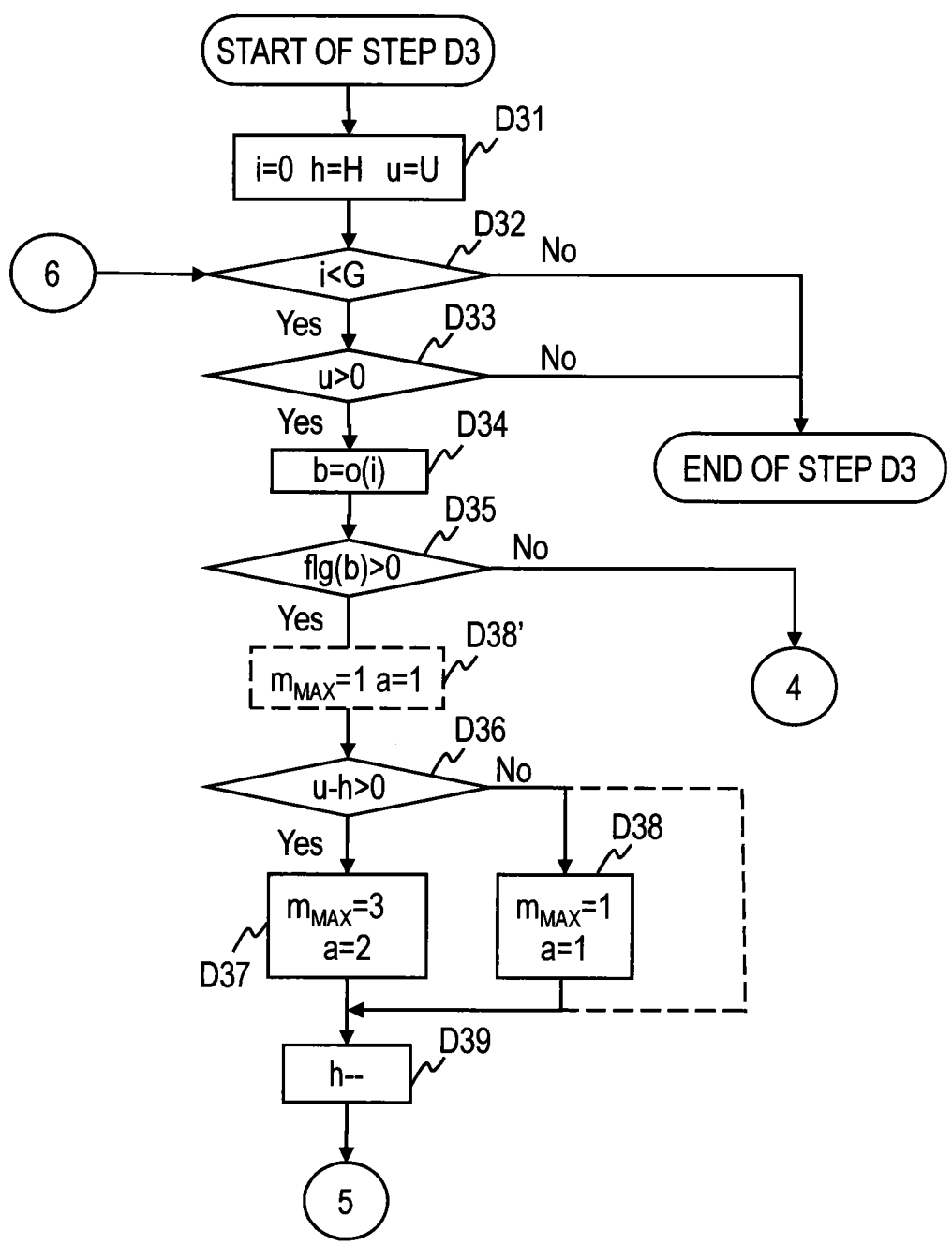
FIG. 6 is a flowchart illustrating an example of step D3.
Figure 7:
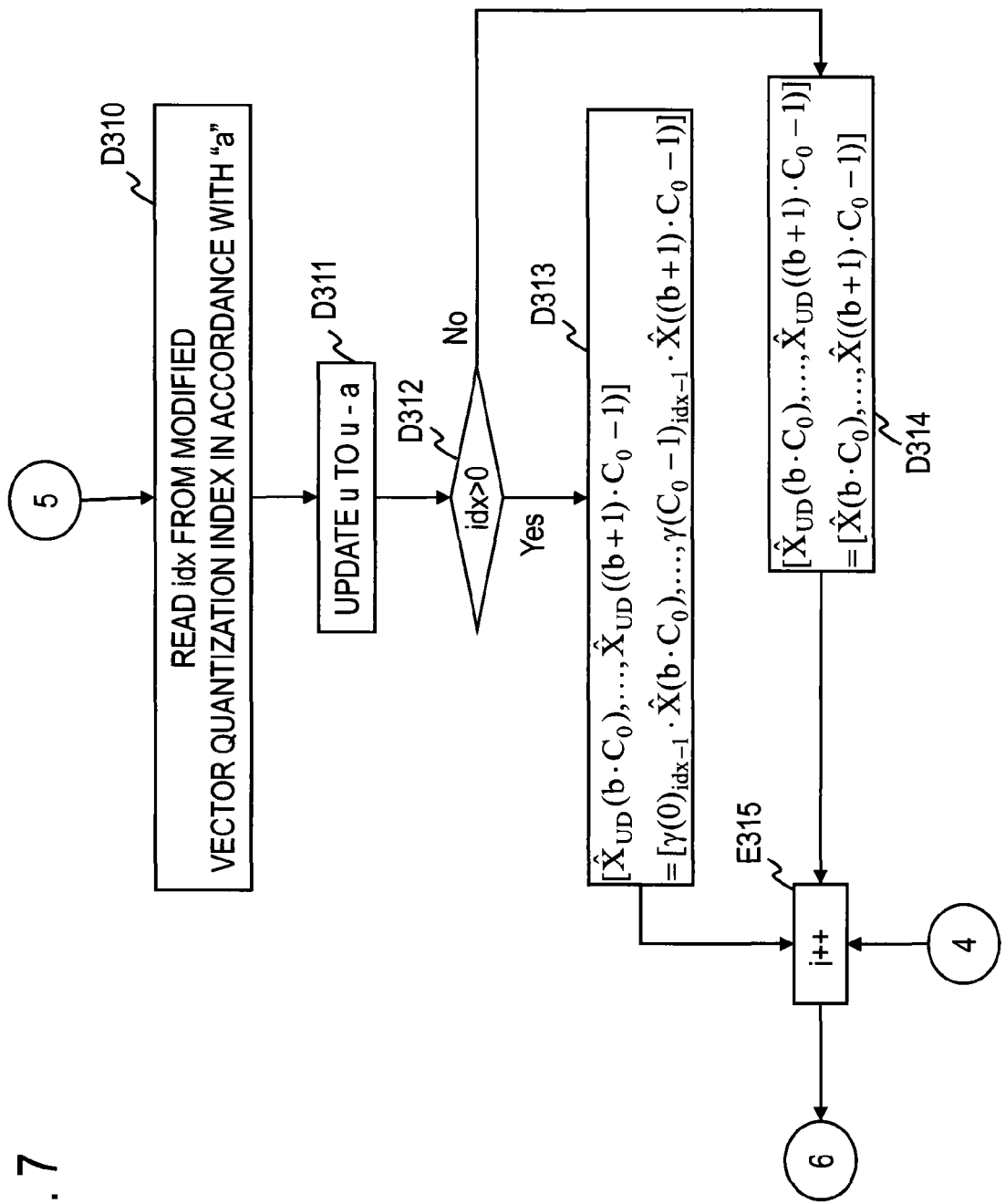
FIG. 7 is a flowchart illustrating the example of step D3.

The gradient adjusting unit 124 in this example performs the steps illustrated in FIGS. 6 and 7 and adjusts the decoded values X^(k).

The gradient adjusting unit 124 initializes the i, h, and u values to 0, H, and U, respectively (step D31), and proceeds to step D32.

The gradient adjusting unit 124 compares i with G ($G=L/C_0$) (step D32) and, if i<G is satisfied, proceeds to step D33 or, if i<G is not satisfied, ends the processing of step D3.

In step D33, the gradient adjusting unit 124 compares u with 0 (step D33) and, if u>0 is not satisfied, ends the processing of step D3 or, if u>0 is satisfied, sets b=o(i) (step D34). Here, o(i) in the encoding device 11 is identical to o(i) in the decoding device 12.

The gradient adjusting unit 124 compares flg(b) with 0 (step D35) and, if flg(b)>0 is not satisfied (flg(b)=0 is satisfied), the gradient adjusting unit 124 increments i by 1 (step D315) and proceeds to step D32. Here, flg(b) is a quantization flag indicating whether vector quantization of the sub-band identified by b has been performed by the vector quantizer 115. For b identifying a sub-band that has been vector-quantized, flg(b)=η (η>0, for example, η=1). For b identifying a sub-band that has not been vector-quantized, flg(b)=0. For example, when the total energy of the decoded values X^(k) of the sub-band identified by b is 0, flg(b)=0 is set; otherwise, flg(b)=1 is set.

If flg(b)>0 is satisfied (flg(b)=η is satisfied) in step D35, the gradient adjusting unit 124 compares u−h with 0 (equivalent to comparing u with h) (step D36). If u−h>0 is satisfied, $m_{MAX}=3$ and a=2 are set (step D37); if u−h>0 is not satisfied, $m_{MAX}=1$ and a=1 are set (step D38).

The gradient adjusting unit 124 decrements h (step D39) and reads the index information idx from the unused bit region included in the modified vector quantization index, in accordance with "a" (step D310). The gradient adjusting unit 124 updates the u value by setting u−a as a new u value (step D311). The gradient adjusting unit 124 decides whether idx>0 is satisfied (whether idx=0 is satisfied) (step D312); and if idx>0 is satisfied (idx=0 is not satisfied), a plurality of decoded values X^(b·$C_0$), ..., X^((b+1)·$C_0$−1) are updated as shown below (step D313), i is incremented by 1 (step D315), and the processing proceeds to step D32.

$$[\hat{X}_{UD}(b \cdot C_0), \ldots, \hat{X}_{UD}((b+1) \cdot C_0-1)] = [\gamma(0)_{idx-1} \cdot \hat{X}(b \cdot C_0), \ldots, \gamma(C_0-1)_{idx-1} \cdot \hat{X}((b+1) \cdot C_0-1)]$$

If idx>0 is not satisfied (idx=0 is satisfied), the gradient adjusting unit 124 does not update the plurality of decoded values X^(b·$C_0$), ..., X^((b+1)·$C_0$−1) (step D314) but increments i by 1 (step D315) and proceeds to step D32, as shown below.

$$[\hat{X}_{UD}(b \cdot C_0), \ldots, \hat{X}_{UD}((b+1) \cdot C_0-1)] = [\hat{X}(b \cdot C_0), \ldots, \hat{X}((b+1) \cdot C_0-1)]$$

[Example 2 of Step D3]

Step D3 may be executed as described below, for example, as illustrated in FIGS. 6 and 7.

After steps D31 to D35 are executed, if it is decided in step D35 that flg(b)>0 is not satisfied (flg(b)=0 is satisfied), the gradient adjusting unit 124 increments i by 1 (step D315) and proceeds to step D32. If it is decided in step D35 that flg(b)>0 is satisfied (flg(b)=η is satisfied), the gradient adjusting unit 124 sets $m_{MAX}=1$ and a=1 (step D38') and proceeds to step D36.

In step D36, the gradient adjusting unit 124 compares u−h with 0 (equivalent to comparing u and h) (step D36) and, if u−h>0 is satisfied, sets $m_{MAX}=3$ and a=2 (step D37) and proceeds to step D39 or, if u−h>0 is not satisfied, proceeds to step D39 without changing $m_{MAX}$ and "a". The remaining part of the processing is the same as in [Example 1 of step D3].

(The Description of [Examples of Step D3] Ends Here).

If decoded signals in the time domain are necessary, the adjusted values $\hat{X}_{UD}(k)$ output from the gradient adjusting unit 124 are input to the time-domain converter 125, and the time-domain converter 125 transforms $\hat{X}_{UD}(k)$ to time-domain signals z(n) by an inverse Fourier transform, for example.

(Features of this Embodiment)

As described above, since the decoding device 12 adjusts a plurality of decoded values $\hat{X}(k)$ by using the gradient coefficient vector selected by the encoding device 11 in this embodiment, musical noise and the like caused by the quantization error can be reduced.

Figure 8:
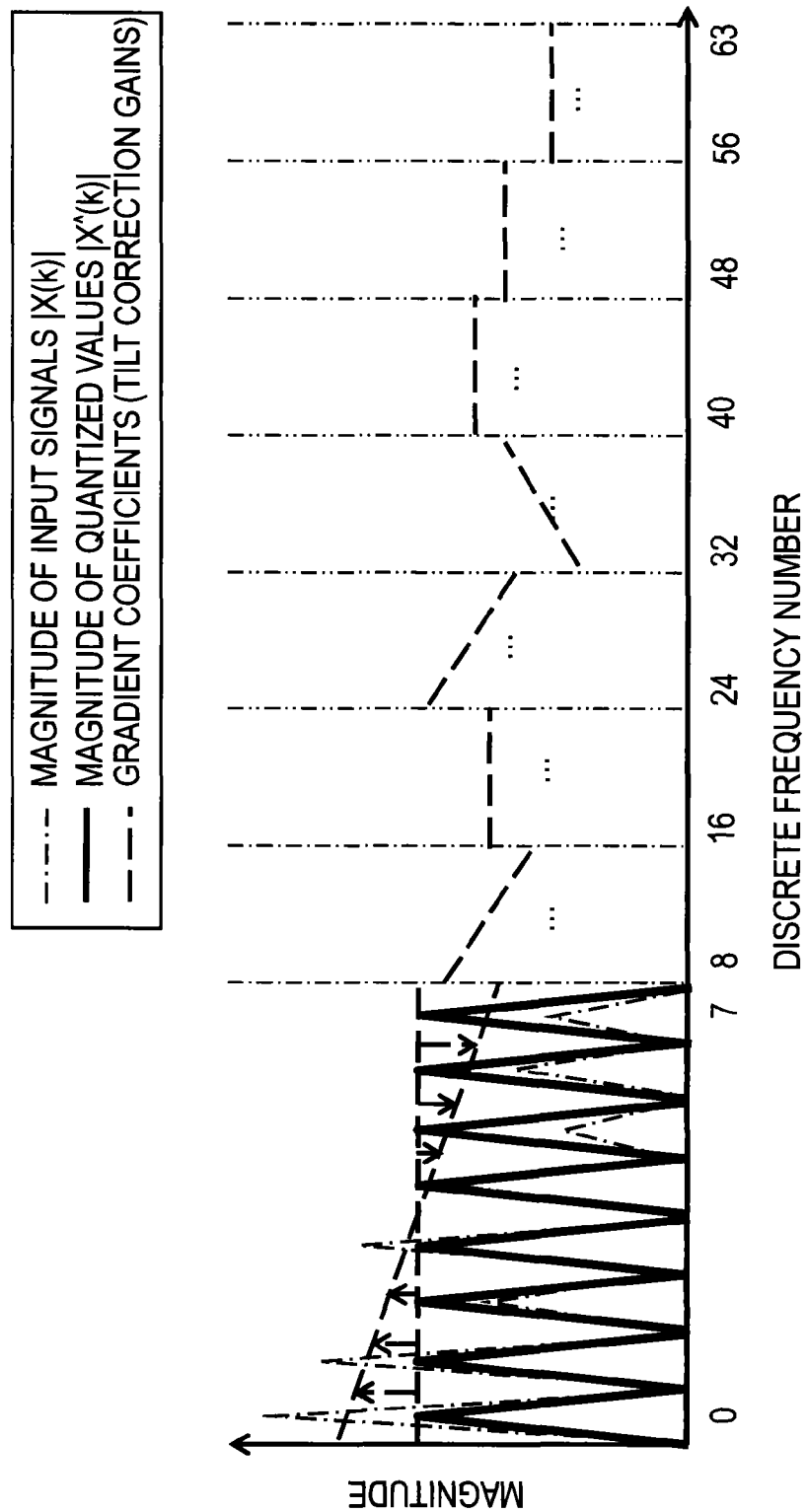
FIG. 8 illustrates an example of the relationship among input signals, quantized values, and gradient coefficients (tilt correction gains).

A vector composed of gradient coefficients $\gamma_m(0), \ldots, \gamma_m(C_0-1)$ that are correlated with one another is specified as a gradient coefficient vector $\gamma_m$ in this embodiment. For example, the gradient coefficient vector $\gamma_m$ is a vector composed of a plurality of gradient coefficients $\gamma_m(0), \ldots, \gamma_m(C_0-1)$ distributed lopsidedly on a straight line or a specific curve in the $(k, \gamma_m(k))$ plane, for example. Input signals such as audio signals or acoustic signals often form a linear or curved envelope. By using the gradient coefficient vector $\gamma_m$ reflecting such characteristics of the input signals, the amount of index information idx can be suppressed while still adjusting the quantization error with high precision. In the example shown in FIG. 8, the magnitude $|X(k)|$ of the input signals in sub-bands k=0, ..., 7 decreases as k increases. By adjusting $|X(0)|, \ldots, |X(7)|$ by using the gradient coefficient vector $\gamma_m$ composed of gradient coefficients $\gamma_m(0), \ldots, \gamma_m(7)$ distributed lopsidedly on a straight line with a negative gradient in the $(k, \gamma_m(k))$ plane, their errors from the magnitudes $|\hat{X}(0)|, \ldots, |\hat{X}(7)|$ of the quantized values can be reduced. By using the gradient coefficient vector $\gamma_m$ suitable for the characteristics of the input signals in each sub-band, the quantization error can be reduced efficiently.

The index information idx for identifying the gradient coefficient vector $\gamma_{m'}$ selected by the encoding device 11 is transmitted by using the unused bit region effectively, eliminating the need for an additional region for transmitting the index information idx.

The upper limit of the number of bits that can be written in the unused bit region is the number of unused bits, U, and the index information idx corresponding to all the sub-bands is not always written in the unused bit region. In this embodiment, the index information idx corresponding to a sub-band having a high priority is written in the unused bit region preferentially. For example, this reduces the quantization error in a sub-band that is important in human auditory perceptual characteristics, allowing musical noise and the like to be reduced.

(Results of Experiment)

The results of an experiment showing the effects of this embodiment will be given below.

In the experiment, the signal-to-noise ratios (SNRs) between the input signals and the decoded signals were obtained under the following two conditions.

Condition 1:

Conventional technology (decoded signals were obtained by decoding a code obtained by vector-quantizing the input signals, as in Patent Literature 1).

Condition 2:

Technology of this embodiment (decoded signals were obtained by decoding a code obtained by performing vector quantization and gradient calculation of the input signals, as in this embodiment).

The SNRs were calculated from frames in which the number U of bits left unused for vector quantization was 1 or larger. Three types of input signals, voice, Japanese music, and Western music, were used. The results are shown in the table below.

TABLE 1

|  | Voice | Japanese music | Western music |
| --- | --- | --- | --- |
| Conventional technology | 6.253 dB | 5.42 dB | 5.5384 dB |
| Technology of this embodiment | 6.7041 dB | 5.7976 dB | 5.7341 dB |

In comparison with the conventional technology, the technology of this embodiment improved the SNRs of the three types of input signals, voice, Japanese music, and Western music, by about 0.35 dB on average.

Modifications

The present invention is not limited to the embodiment described above. For example, if the decoding device 12 includes the smoothing unit 126, the smoothing unit 126 receives the adjusted value $\hat{X}_{UD}(k)$ obtained in step D3 (FIG. 5) and, if an adjusted value $\hat{X}_{UD}(k)'$ older than the adjusted value $\hat{X}_{UD}(k)$ is not 0, outputs a weighted sum of the older adjusted value $\hat{X}_{UD}(k)'$ and the current adjusted value $\hat{X}_{UD}(k)$ as a smoothed value $\hat{X}_{POST}(k)$. If $\hat{X}_{UD}(k)'$ is 0, the smoothing unit 126 does not obtain the weighted sum of the adjusted values, which means that the smoothing unit 126 does not smooth out the adjusted values, but outputs $\hat{X}_{UD}(k)$ as $\hat{X}_{POST}(k)$ (step D4' in FIG. 5). The older adjusted values $\hat{X}_{UD}(k)$ include an adjusted value obtained in step D3 for the frame immediately before the frame corresponding to the adjusted value $\hat{X}_{UD}(k)$ and the smoothed value obtained in step D4' for the frame immediately before the frame corresponding to the adjusted value $\hat{X}_{UD}(k)$.

$\hat{X}_{POST}(k)$ is given by the following equations, where $\alpha$ and $\beta$ are adjustment factors and are determined appropriately depending on the requirements and specifications. For example, $\alpha=0.85$ and $\beta=0.15$. $\phi(\bullet)$ indicates a plus or minus sign of $\bullet$.

$$\begin{cases} \hat{X}_{POST}(k) = \hat{X}_{UD}(k) & \text{if } \hat{X}_{UD}(k)' = 0 \\ \hat{X}_{POST}(k) = \{\alpha \cdot |\hat{X}_{UD}(k)| + \beta \cdot |\hat{X}_{UD}(k)'|\} \cdot \phi(\hat{X}_{UD}(k)) & \text{otherwise} \end{cases}$$

Consequently, musical noise and the like caused by the discontinuity over time in the amplitude characteristics of $\hat{X}_{UD}(k)$ can be reduced. If decoded signals in the time domain are necessary, $\hat{X}_{POST}(k)$ output from the smoothing unit 126 is input to the time-domain converter 125. The time-domain converter 125 transforms $\hat{X}_{POST}(k)$ to time-domain signals z(n) by an inverse Fourier transform, for example.

In addition, $\alpha$ and $\beta$ may be varied in accordance with the requirements and specifications.

The input signals X(k) do not need to be frequency-domain signals and can be any signals, such as time-domain signals. The present invention can be applied to encoding and decoding of any signals other than frequency-domain signals. In this case, the gradient coefficients $\gamma_m(0), \ldots, \gamma_m(C_0-1)$ corresponding to the same row number m are distributed lopsidedly on a straight line or a specific curve in the (k', $\gamma_m$(k')) plane having k' (value corresponding to time corresponding to the gradient coefficient $\gamma_m$(k')) on its first axis and $\gamma_m$(k') (value of gradient coefficient) on its second axis, for example. More specifically, the gradient coefficients $\gamma_m$(0), . . . , $\gamma_m$($C_0$−1) corresponding to the same row number m are positioned on a straight line or a specific curve in the (k', $\gamma_m$(0)) plane, for example. In this modification, k and k' are discrete time numbers corresponding to discrete time, and the positions of samples are positions on the time axis corresponding to the discrete time numbers k. If k and k' are discrete time numbers, a larger value of k or k' corresponds to a later time.

Step E3 may be executed such that a normalization value $F_{GAIN}$ for the input signals X(k) is determined in each frame, the vector quantizer 115 uses a value obtained by normalizing the value X(k) of each sample of the input signals with the normalization value $F_{GAIN}$ instead of X(k) and uses a value obtained by normalizing the quantized normalization value A with the normalization value $F_{GAIN}$ instead of $_\tau X^-$. When step E3 is executed, X(k) may be replaced with X(k)/$F_{GAIN}$, and $_\tau X^-$ may be replaced with $_\tau X^-$/$F_{GAIN}$, for example. In that case, the normalization value calculator 112 is not necessary, and a value obtained by normalizing X(k) with the normalization value $F_{GAIN}$ may be input to the normalization value quantizer 113, instead of the quantized normalization value $_\tau X^-$. Then, the vector quantizer 115 may execute step E3 by using a quantized value of a value obtained by normalizing X(k) with the normalization value $F_{GAIN}$ instead of the quantized normalization value $_\tau X^-$. The normalization-value quantization index may correspond to a quantized value of a value obtained by normalization with the normalization value $F_{GAIN}$.

In the above-described embodiment, the gradient calculator 116 of the encoding device 11 decides whether idx>0 is satisfied and, if idx>0 is satisfied, updates a plurality of quantized values X^(b·$C_0$), . . . , X^((b+1)·$C_0$−1) or, if idx>0 is not satisfied, does not update the values (steps E418 to E421 in FIG. 4). The gradient adjusting unit 124 of the decoding device 12 decides whether idx>0 is satisfied and, if idx>0 is satisfied, updates a plurality of quantized values X^(b·$C_0$), . . . , X^((b+1)·$C_0$−1) or, if idx>0 is not satisfied, does not update the values (steps D312 to D314 in FIG. 7). As a modification, a row vector (gradient coefficient vector) $\gamma_{-1}$ = [$\gamma_{-1}$(0), . . . , $\gamma_{-1}$($C_0$−1)]=[1, . . . , 1] of the row number m=−1, composed of only elements "1" is added to the gradient matrix γ given by Equation (1), and the gradient calculator 116 and the gradient adjusting unit 124 may calculate the following, irrespective of whether idx>0 is satisfied.

$$[\hat{X}_{UD}(b \cdot C_0), \ldots, \hat{X}_{UD}((b+1) \cdot C_0-1)] = [\gamma(0)_{idx-1} \cdot \hat{X}((b \cdot C_0), \ldots, \gamma(C_0-1)_{idx-1} \cdot \hat{X}((b+1) \cdot C_0-1)]$$

The specific example values of the row number m and the index information idx do not limit the present invention. The numbers of m and idx given above may increase or decrease, and some of the numbers may be unused.

In the embodiment described above, the index information idx is stored in the unused bit region of U unused bits, but the index information idx may not be stored in the unused bit region.

The index information idx may be stored in another finite bit region having U bits included in the code. In that case, the processing may be executed with the unused bit region being replaced with the finite bit region and the U unused bits being replaced with U bits in the finite bit region.

The processing described above may be executed in the order in which it is described or may be executed in parallel or separately in accordance with the capabilities of the apparatus executing the processing or with necessity. Other modifications can be made without departing from the scope of the invention.

Hardware, Program, and Recording Medium

The encoding device 11 and the decoding device 12 are configured by a known or special-purpose computer that includes a central processing unit (CPU) and a random access memory (RAM), and a special program in which the processing described above is written, for example. In that case, the special program is read into the CPU, and the CPU runs the special program to implement each function. The special program may be configured by a single program string or may carry out the objective by reading another program or library.

The program can be recorded on a computer-readable recording medium. Examples of the computer-readable recording medium include a magnetic recording apparatus, an optical disc, a magneto-optical recording medium, and a semiconductor memory. Examples of the computer-readable recording medium are non-transitory recording media. The program is distributed, for example, by selling, transferring, or lending a DVD, a CD-ROM, or other transportable recording media on which the program is recorded. The program may be stored in a storage of a server computer and may be distributed by transferring the program from the server computer to another computer through a network.

The computer that executes the program stores the program recorded on a transportable recording medium or the program transferred from the server computer, in its own memory. When the processing is executed, the computer reads the program stored in its own memory and executes the processing in accordance with the read program. The program may also be executed with other methods: The computer may read the program directly from the transportable recording medium and execute the processing in accordance with the program; and each time the program is transferred from the server computer to the computer, the processing may be executed according to the transferred program.

At least a part of the processing units of the encoding device 11 or the decoding device 12 may be configured by a special integrated circuit.

DESCRIPTION OF REFERENCE NUMERALS

11: Encoding device
111: Frequency-domain converter
112: Normalization value calculator
113: Normalization value quantizer
115: Vector quantizer
116: Gradient calculator
12: Decoding device
121: Normalization value decoder
122: Vector decoder
124: Gradient adjusting unit
125: Time-domain converter
126: Smoothing unit

What is claimed is:

1. An encoding method comprising:
a vector quantization step of vector-quantizing a plurality of samples collectively to obtain a vector quantization index and the quantized value of each of the plurality of samples;
a bit assignment step of assigning bits in a predetermined order of priority based on auditory perceptual characteristics to one or more sets of sample positions among a plurality of sets of sample positions, each set comprising a plurality of sample positions and being given an order of priority based on the auditory perceptual characteristics, the number of bits not being larger than the number of bits obtained by subtracting the number of bits used for a code corresponding to the vector quantization index from the number of bits assigned for the code corresponding to the vector quantization index; and a coefficient group selection step of outputting index information indicating a group of coefficients that minimizes the sum of the error between the value of each sample included in each of the sets of sample positions to which the bits are assigned in the bit assignment step and the value obtained by multiplying the quantized value of each sample included in the set of sample positions by a coefficient corresponding to the position of the sample, of all the sample positions included in the set of sample positions, among a plurality of groups of predetermined coefficients corresponding to the positions of the samples.

2. The encoding method according to claim 1, wherein the number of bits assigned to a first set of sample positions among the sets of sample positions is not smaller than the number of bits assigned to a second set of sample positions among the sets of sample positions having lower priority than the first set of sample positions.

3. The encoding method according to claim 1, wherein the bit assignment step comprises the steps of:

when the number of remaining bits that are left unassigned to any of the sets of sample positions, among the bits that are not used for the code corresponding to the vector quantization index, is not larger than the number of sets of sample positions to which bits are not assigned, among the plurality of sets of sample positions, assigning a first number of bits to the set of sample positions that has the highest priority among the sets of sample positions to which the bits are not assigned; and when the number of remaining bits is larger than the number of sets of sample positions to which bits are not assigned, among the plurality of sets of sample positions, assigning a second number of bits which is larger than the first number of bits to the set of sample positions that has the highest priority among the sets of sample positions to which bits are not assigned.

4. The encoding method according to one of claims 1 to 3, wherein the groups of coefficients are each formed of coefficients disposed on a straight line in a plane having values of frequency or time corresponding to the sample positions with which the coefficients are associated on a first axis thereof and the values of the coefficients on a second axis thereof; and the coefficients of each of the plurality of groups of coefficients are disposed in the plane on a straight line having a different gradient from straight lines for the other groups.

5. The encoding method according to one of claims 1 to 3, wherein the groups of coefficients are each formed of coefficients distributed lopsidedly on a straight line or a specific curve in a plane having values of frequency or time corresponding to the sample positions with which the coefficients are associated on a first axis thereof and the values of the coefficients on a second axis thereof; and the coefficients of the plurality of groups of coefficients are disposed lopsidedly in the plane on straight lines that are not parallel to the first axis or specific curves.

6. A non-transitory computer-readable recording medium having stored thereon a program for causing a computer to execute the steps of the encoding method according to claim 1.

7. A decoding method comprising:

a vector decoding step of obtaining a plurality of values corresponding to an input vector quantization index as decoded values corresponding respectively to a plurality of sample positions; and a coefficient multiplication step of outputting, with a set of sample positions to which bits are assigned in a predetermined order of priority based on auditory perceptual characteristics being considered as a target of processing among a plurality of sets of sample positions that constitute the plurality of sample positions, and with the use of a group of predetermined coefficients corresponding to the plurality of sample positions and indicated by input index information, the values obtained by multiplying the decoded values and the coefficients corresponding to the sample positions included in the set of sample positions considered as the target of processing.

8. The decoding method according to claim 7, wherein the group of coefficients is formed of coefficients disposed on a straight line in a plane having values of frequency or time corresponding to the sample positions with which the coefficients are associated on a first axis thereof and the values of the coefficients on a second axis thereof; and the coefficients of each of the plurality of groups of coefficients are disposed in the plane on a straight line having a different gradient from straight lines for the other groups.

9. The decoding method according to claim 7, wherein the group of coefficients is formed of coefficients distributed lopsidedly on a straight line or a specific curve in a plane having values of frequency or time corresponding to the sample positions with which the coefficients are associated on a first axis thereof and the values of the coefficients on a second axis thereof; and the coefficients of the plurality of groups of coefficients are disposed lopsidedly in the plane on straight lines that are not parallel to the first axis or specific curves.

10. A non-transitory computer-readable recording medium having stored thereon a program for causing a computer to execute the steps of the decoding method according to claim 7.

11. An encoding device comprising:

a vector quantizer that vector-quantizes a plurality of samples collectively to obtain a vector quantization index and the quantized value of each of the plurality of samples;

a bit assignment unit that assigns bits in a predetermined order of priority based on auditory perceptual characteristics to one or more sets of sample positions among a plurality of sets of sample positions, each set comprising a plurality of sample positions and being given an order of priority based on the auditory perceptual characteristics, the number of bits not being larger than the number of bits obtained by subtracting the number of bits used for a code corresponding to the vector quantization index from the number of bits assigned for the code corresponding to the vector quantization index; and a coefficient group selection unit that outputs index information indicating a group of coefficients that minimizes the sum of the error between the value of each sample included in each of the sets of sample positions to which the bits are assigned by the bit assignment unit and the value obtained by multiplying the quantized value of each sample included in the set of sample positions by a coefficient corresponding to the position of the sample, of all the sample positions included in the set of sample positions, among a plurality of groups of predetermined coefficients corresponding to the positions of the samples.

12. The encoding device according to claim 11, wherein the number of bits assigned to a first set of sample positions among the sets of sample positions is not smaller than the number of bits assigned to a second set of sample positions among the sets of sample positions having lower priority than the first set of sample positions.

13. The encoding device according to claim 11, wherein when the number of remaining bits that are left unassigned to any of the sets of sample positions, among the bits that are not used for the code corresponding to the vector quantization index, is not larger than the number of sets of sample positions to which bits are not assigned, among the plurality of sets of sample positions, the bit assignment unit assigns a first number of bits to the set of sample positions that has the highest priority among the sets of sample positions to which the bits are not assigned, and when the number of remaining bits is larger than the number of sets of sample positions to which bits are not assigned, among the plurality of sets of sample positions, the bit assignment unit assigns a second number of bits which is larger than the first number of bits to the set of sample positions that has the highest priority among the sets of sample positions to which bits are not assigned.

14. The encoding device according to one of claims 11 to 13, wherein the groups of coefficients are each formed of coefficients disposed on a straight line in a plane having values of frequency or time corresponding to the sample positions with which the coefficients are associated on a first axis thereof and the values of the coefficients on a second axis thereof; and the coefficients of each of the plurality of groups of coefficients are disposed in the plane on a straight line having a different gradient from straight lines for the other groups.

15. The encoding device according to one of claims 11 to 13, wherein the groups of coefficients are each formed of coefficients distributed lopsidedly on a straight line or a specific curve in a plane having values of frequency or time corresponding to the sample positions with which the coefficients are associated on a first axis thereof and the values of the coefficients on a second axis thereof; and the coefficients of the plurality of groups of coefficients are disposed lopsidedly in the plane on straight lines that are not parallel to the first axis or specific curves.

16. A decoding device comprising:

a vector decoder that obtains a plurality of values corresponding to an input vector quantization index as decoded values corresponding respectively to a plurality of sample positions; and a coefficient multiplication unit that outputs, with a set of sample positions to which bits are assigned in a predetermined order of priority based on auditory perceptual characteristics being considered as a target of processing among a plurality of sets of sample positions that constitute the plurality of sample positions, and with the use of a group of predetermined coefficients corresponding to the plurality of sample positions and indicated by input index information, the values obtained by multiplying the decoded values and the coefficients corresponding to the sample positions included in the set of sample positions considered as the target of processing.

17. The decoding device according to claim 16, wherein the group of coefficients is formed of coefficients disposed on a straight line in a plane having values of frequency or time corresponding to the sample positions with which the coefficients are associated on a first axis thereof and the values of the coefficients on a second axis thereof; and the coefficients of each of the plurality of groups of coefficients are disposed in the plane on a straight line having a different gradient from straight lines for the other groups.

18. The decoding device according to claim 16, wherein the group of coefficients is formed of coefficients distributed lopsidedly on a straight line or a specific curve in a plane having values of frequency or time corresponding to the sample positions with which the coefficients are associated on a first axis thereof and the values of the coefficients on a second axis thereof; and the coefficients of the plurality of groups of coefficients are disposed lopsidedly in the plane on straight lines that are not parallel to the first axis or specific curves.

* * * * *